United States Patent [19]
Bruel

[11] Patent Number: 5,804,086
[45] Date of Patent: Sep. 8, 1998

[54] STRUCTURE HAVING CAVITIES AND PROCESS FOR PRODUCING SUCH A STRUCTURE

[75] Inventor: Michel Bruel, Veurey, France

[73] Assignee: Commissariat a l'Energie Atomique, Paris, France

[21] Appl. No.: 676,228

[22] PCT Filed: Jan. 25, 1995

[86] PCT No.: PCT/FR95/00078

§ 371 Date: Aug. 1, 1996

§ 102(e) Date: Aug. 1, 1996

[87] PCT Pub. No.: WO95/20824

PCT Pub. Date: Aug. 3, 1995

[30] Foreign Application Priority Data

Jan. 26, 1994 [FR] France .................................. 94 00835

[51] Int. Cl.⁶ .................................................. H01L 21/58
[52] U.S. Cl. .................... 216/33; 216/2; 216/36; 216/52; 216/56; 216/62; 216/65; 216/88; 438/53
[58] Field of Search ................... 216/34, 36, 62, 216/65, 2, 33, 52, 56, 88; 156/631.1, 647.1; 437/24; 438/53, 692, 705, 707, 924

[56] References Cited

U.S. PATENT DOCUMENTS

| | | | |
|---|---|---|---|
| 4,121,334 | 10/1978 | Wallis | 29/589 |
| 4,894,709 | 1/1990 | Philips et al. | 357/82 |
| 5,034,343 | 7/1991 | Rouse et al. | 437/86 |
| 5,198,371 | 3/1993 | Li | 437/11 |
| 5,374,564 | 12/1994 | Bruel | 437/24 |
| 5,415,727 | 5/1995 | Gal et al. | 216/33 |
| 5,632,854 | 5/1997 | Mirza et al. | 216/33 |

FOREIGN PATENT DOCUMENTS

619471 A1 10/1994 European Pat. Off. .

*Primary Examiner*—R. Bruce Breneman
*Assistant Examiner*—Anita Alanko
*Attorney, Agent, or Firm*—Oblon, Spivak, McClelland, Maier & Neustadt, P.C.

[57] ABSTRACT

This process for producing a structure incorporating a substrate (2), a thin surface film (16) made from a non-conducting material joined to one face (1) of the substrate (2), said substrate (2) having cavities (10) flush with said face (1), comprises the following successive stages:

etching cavities (10) in one face (1) of a substrate, the cavities having in the plane of the substrate face at least one dimension which is a function of the thickness of the surface film, in order to correctly secure the latter, joining a non-conducting material wafer (12) to the face (1) of the substrate (2), thinning the wafer (12) to obtain the thin surface film.

11 Claims, 2 Drawing Sheets

STRUCTURE HAVING CAVITIES AND PROCESS FOR PRODUCING SUCH A STRUCTURE

TECHNICAL FIELD

The present invention relates to a structure having a substrate able to support a surface film or section made from a non-conducting material for the possible production of integrated circuits and internal cavities beneath the surface film in the substrate, as well as a process for producing such a structure.

The invention applies in general terms to the fields of microelectronics and in particular microelectronic devices requiring a good heat dissipation.

PRIOR ART

Structures having internal cavities are known in microelectronics, particularly for their heat dissipation capacity. Document (1) "Formation of silicon reentrant cavity heat sinks using anisotropic etching and direct wafer bonding" by Ajay Goyal et al, IEEE Electron Device Letters, vol. 14, No. 1, January 1993 illustrates this.

This document discloses a two-part structure. A first part serves as the substrate for e.g. producing integrated circuits. It is joined by a second part in which are etched cavities. This document also suggests the use of a cooling fluid within the cavities. The cavities e.g. make it possible to retain vapours of the cooling fluid and give the structure the property of absorbing significant thermal variations of the integrated circuit or circuits of the first part.

In general terms, in such structures, and for technical manufacturing reasons, the first part carrying the integrated circuits is relatively thick. The thickness of this part is one of the main limitations to the efficiency of heat dissipation by the cavities, because the heat produced must traverse said thickness before arriving at the second part having the cavities.

An object of the present invention is to produce two-part structures, where the first part which may have integrated circuits is very thin and where the second part is provided with cavities.

The fact of having a first thin part makes it possible to envisage for the structures various applications where the cavities can also fulfil functions other than that of heat dissipation. It is e.g. possible by making openings in the first thin part, to carry out in the cavities of the second part other technological operations such as metal depositions in order to produce connections and/or electrodes or operations permitting the production of various elements.

DESCRIPTION OF THE INVENTION

In order to increase the efficiency of the heat dissipation of two-part structures as described hereinbefore and/or envisage novel uses for such structures, the present invention relates to a process for producing a structure incorporating a substrate, a thin surface film made from a non-conducting material joined to one face of the substrate, said substrate having cavities flush with said face, comprises the following successive stages:
etching cavities in one face of a substrate, the cavities having in the plane of the substrate face at least one dimension which is a function of the thickness of the surface film, in order to correctly secure the latter,
joining a non-conducting material wafer to the face of the substrate,
thinning the wafer to obtain the thin surface film.

Joining is understood to mean any operation between the substrate and the wafer making it possible to ensure an adequate bonding energy between said two elements such that they do not separate during subsequent operations. Reference can e.g. be made to surface treatment operations permitting the production of interatomic bonds, adhesion operations, etc.

The term non-conducting layer relates both to a single layer produced from a semi-conductor material or insulating material and a plurality of sublayers, whereof at least one is made from a semi-conductor or insulating material.

Several variants are possible for thinning the wafer. It is firstly possible to reduce the thickness of the wafer by mechanical, chemical or mechanochemical abrasion treatments.

The abrasion of the wafer can take place by grinding or polishing processes, which are known per se. The choice of the dimensions of the cavities as a function of the thickness of the surface section or film avoids deformations of the wafer and irregularities of the thinning during abrasion.

In the case of particularly fragile structures or when it is wished to obtain a very thin wafer, the mechanical or mechanochemical stresses of the abrasion can give rise to a disengagement or tearing of the wafer. Moreover, this type of abrasion and also chemical abrasions can perforate the wafer as a result of etching inhomogeneities.

Thus, according to a special aspect of the invention, the non-conducting material wafer can have a solid portion, an intermediate layer and a thin surface film. Thus, the wafer is joined to the substrate with the thin film coming on said face of the substrate and the wafer is thinned by separating the film of the solid part from the intermediate layer.

In order to separate the thin film from the wafer, it is e.g. possible to cleave the wafer with a cleaving process along a given cleaving plane. Cleaving is understood to mean any separation into two parts of the wafer, preferably in accordance with one plane.

This cleaving process, which is particularly recommended for obtaining wafers or inhomogeneous and very thin films consists of implanting by bombardment in the wafer ions of rare gas or hydrogen in order to form a thin layer of gaseous microbubbles, which constitutes said intermediate layer and which defines the cleaving plane separating the solid portion and the thin film in the wafer. After cleaving, this film constitutes the thin surface section of the structure according to the invention.

Cleaving takes place by heating the wafer in order to create by a pressure effect in the microbubbles and crystalline rearrangement, a separation of the two parts.

Such a process is e.g. described in document (2) FR-A-2 681 472. In order to permit the detachment of the thin surface part without tearing or deforming it, prior to the cleaving operation and as defined in document (2), it is necessary to bring it into intimate contact with a securing structure known as a "stiffener".

According to the present invention, the substrate takes the place of the stiffener. Before joining the wafer to the substrate, the wafer is subject to a bombardment, e.g. of rare gas ions, in order to form there a layer of microbubbles defining a thin surface portion, which comes into contact with the face of the substrate.

Surprisingly the cavities etched in the supporting substrate do not prevent the correct securing of the thin portion of the wafer. The invention is based on the finding that the principle of intimate contact between the wafer to be cleaved and the substrate can be locally broken. This property is verified when the cavities have in each case in the plane of the etched face of the substrate at least one dimension l equal to or below a maximum value $l_o$, which is a function of the thickness of the surface film or section which it is wished to obtain.

The dimension l of the cavity is understood to mean either its diameter, when it is cylindrical or hemispherical, or a width or length. In a particular case where the cavities are trenches, the dimension l will be the width of these trenches. When the wafer is of silicon, $l_o$ is chosen proportional to the thickness $e_o$ of the surface film with $l_o=10e_o$, thus proving $l \leq l_o=10e_o$.

According to an aspect of the invention, the intermediate layer can also be selectively etched with respect to the thin film and with respect to the solid portion. The separation of the thin film and the solid portion can take place by eliminating the intermediate layer by etching.

For example, it is possible to form a wafer having a thin silicon film separated from a solid portion by an intermediate, silicon oxide layer, the latter being selectively etchable by hydrofluoric acid.

Such a wafer can e.g. be produced by oxygen implantation in a silicon substrate, followed by the high temperature annealing of the substrate to form the intermediate silicon oxide layer.

For an effective and reliable implementation of the invention, it is necessary to accurately check the width of the cavities during the substrate face etching operation. The etching of the cavities can be carried out by any known process, such as advantageously a conventional dry etching or a laser method, as described hereinafter.

Said latter etching takes place in accordance with a procedure similar to anisotropic etching and laser beam machining. It is based on the etching speed difference of the <111> crystallographic planes compared with the other crystallographic planes.

According to this method, local destruction takes place, in accordance with the patterns of cavities to be produced, of the <111> crystallographic planes by locally melting the layer to be etched by means of a laser beam. A chemical treatment then makes it possible to eliminate the laser beam etched areas, the <111> planes not destroyed by the laser beam then serving as a "barrier layer". As a result of this method, it is possible to obtain trenches, whose width, depth and location can be very accurately checked.

The document "Laser machining and anisotropic etching of <111> silicon for applications in microsystems", by M. Alavi et al in "Micro System Technologies 92", 3rd International Conference on Micro Electro, Opto, Mechanic Systems and Components, Berlin, Oct. 21–23, 1992, vde-verlag gmbh—Herbert Reichl, Berlin Offenbach, illustrates this etching method.

DETAILED DESCRIPTION OF EMBODIMENTS OF THE INVENTION

The first operation of the process consists of etching cavities in a substrate. The substrate is e.g. a cylindrical, semi-conductor material plate.

Figure 1:
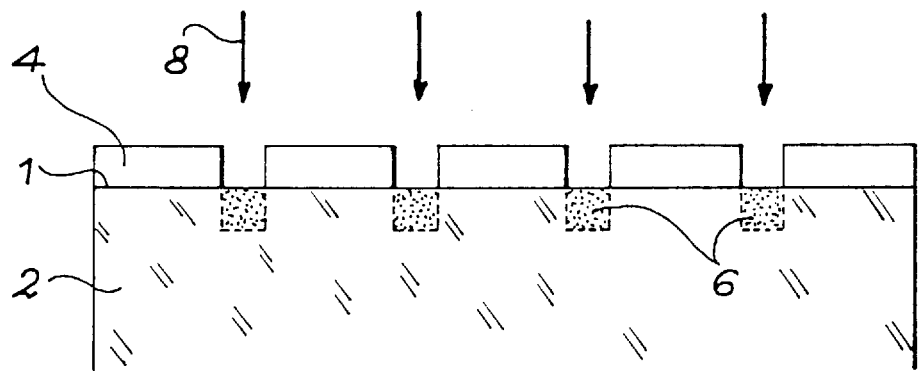
FIGS. 1 and 2 are diagrammatic sections of a substrate and illustrate an operation of etching said substrate according to the invention.

To prepare said etching, it is e.g. possible in the manner illustrated in FIG. 1, to prepare one face 1 of a substrate 2 by means of a prior laser beam treatment. In the embodiment described, where the substrate 2 is of silicon, the e.g. silicon oxide or silicon nitride mask 4 makes it possible to define areas 6 known as "melted areas" in which the <111> crystallographic planes of the substrate are destroyed by a laser beam 8.

Figure 2:
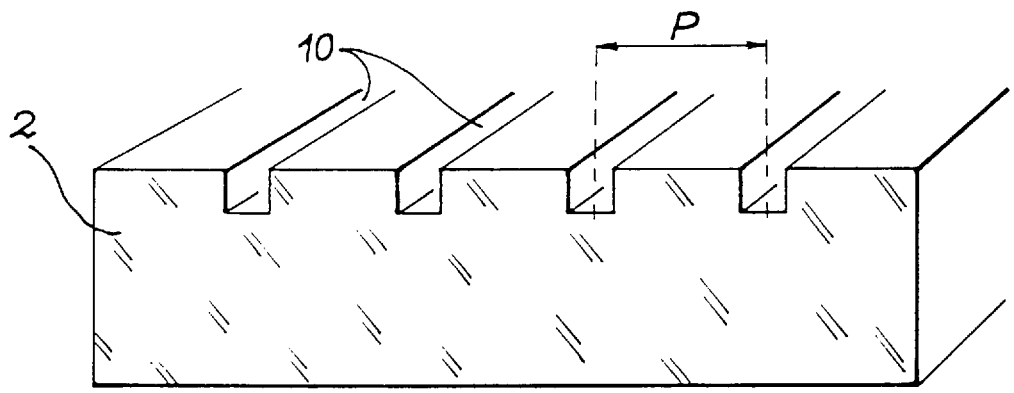

Following said first treatment, the substrate 2 undergoes etching. This etching operation takes advantage of the etching speed difference between the <111> crystallographic planes and the other planes. In the present case, the <111> crystallographic planes not destroyed by the laser treatment and surrounding the melted areas 6 serve as a "barrier layer" for the etching operation. It is thus possible to very precisely form cavities 10 in the substrate 2, as shown in FIG. 2. Other etching processes can clearly be used for producing the cavities 10 of the substrate 2.

The shape of the cavities can vary very widely. However, in the embodiment shown in FIG. 2, the cavities 10 are trenches extending lengthwise on face 1.

The trenches 10 can have a maximum length L of the order of magnitude of the diameter of face 1 of substrate 2. The width of the trenches, measured perpendicular to their length, in the plane of the face 1 has, according to the invention, a value $1 \leq l_o$ in which $l_o$ is proportional to the thickness of the thin surface film which will be subsequently produced e.g. giving $l_o=10$ μm and l=8 μm. These values are e.g. suitable for a surface film with a thickness $e_o$ of 800 nm. As shown in FIG. 2, the trenches are arranged in accordance with a network, whose spacing P is e.g. approximately 200 μm. For reasons of clarity, FIG. 2 only shows four trenches. For a network having two series of orthogonal trenches, each series can have approximately 500 trenches for an approximately 10 cm substrate with a spacing of 200 μm.

Figure 4:
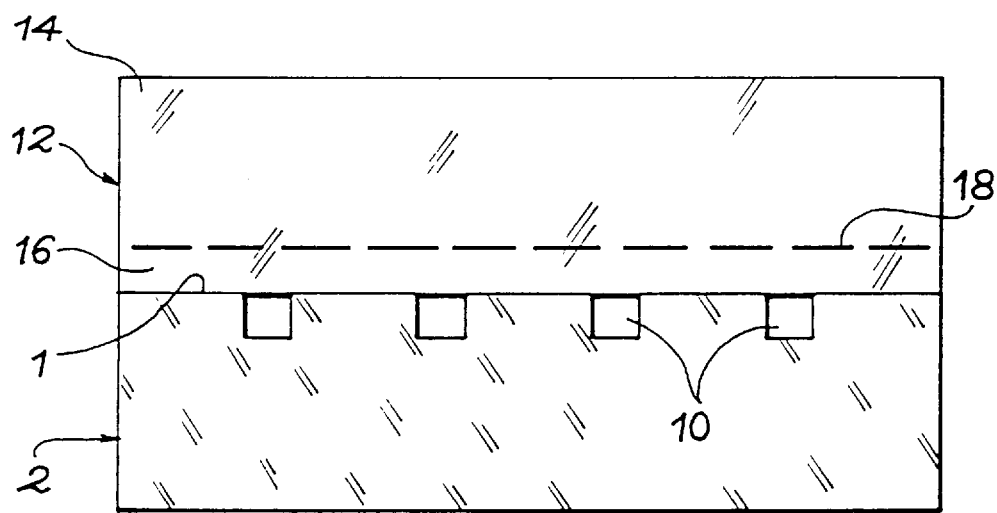
FIG. 4 is a diagrammatic section of the wafer and the substrate and illustrates the transfer of the wafer to the substrate.
Figure 5:
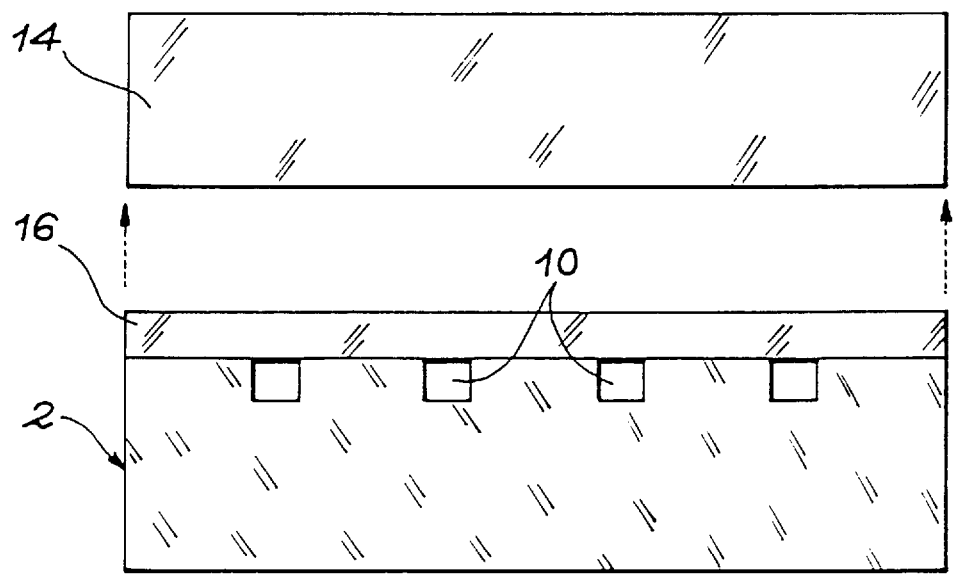
FIG. 5 is a diagrammatic section of the structure according to the invention and illustrates a wafer cleaving phase.

When the cavities or trenches are etched, a non-conducting material wafer 12 is, as shown in FIG. 4, joined to the face 1 of the substrate 2. In exemplified manner a monocrystalline silicon wafer is used. Said wafer must then be thinned in order to obtain a thin surface film.

Thinning of the wafer 12 can e.g. take place mechanically by abrasion or polishing, or can take place chemically or mechanochemically. In the embodiment described, thinning advantageously takes place by a cleaving permitting the obtaining of the thin surface film. During said cleaving operation, the substrate 2 serves as a stiffener to prevent the tearing of the film. The joining between the substrate 2 and the wafer 12 is sufficiently solid to ensure that, despite the presence of the cavities 10, the future thin film is secured.

For joining purposes, a substance adhering both to the wafer 12 and the substrate 2 can be used. If it is not wished to use an adhesive substance, joining can also be brought about by the preparation of at least one of the surfaces to be joined and by a heat treatment optionally matched with the pressure chosen in order to favour interatomic bonds between the substrate 2 serving as the stiffener and the wafer 12.

To join the wafer 12 to the substrate 2, it is appropriate to define a cleaving plane, which separates on the one hand a solid portion 14 of the wafer 12 and a thinner surface film 16, which will constitute the future thin section.

Figure 3:
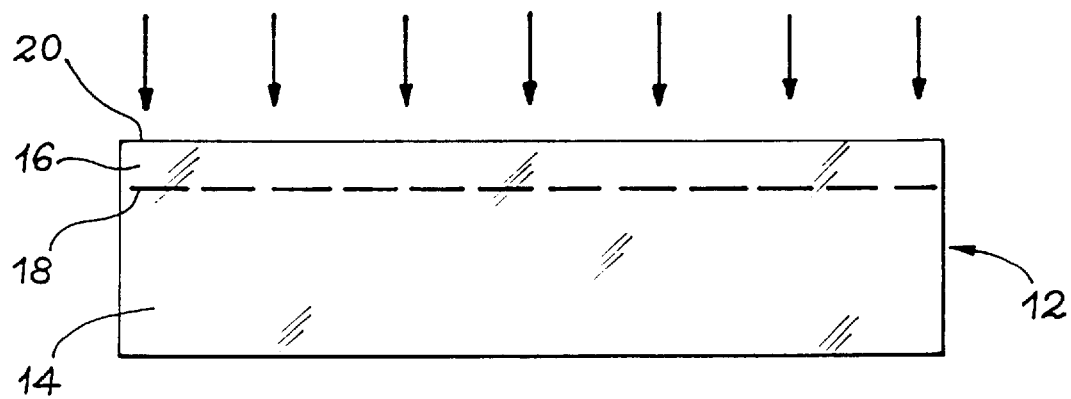
FIG. 3 is a diagrammatic section of a non-conducting material wafer in which is produced, by implantation, a layer of gaseous bubbles.

The cleaving plane is defined by a very thin layer 18 of hydrogen gas or rare gas microbubbles produced by implantation in the wafer 12. To this end and as shown in FIG. 3, one face 20 of the wafer 12 is bombarded with ions.

In exemplified manner, an implantation of protons takes place in the silicon wafer 12 with an energy of 90 keV, which makes it possible to form the layer 18–800 nm from the face 20 of the wafer 12, i.e. the thickness of the future thin section.

When the layer of microbubbles is formed, it is possible to carry out the aforementioned joining by contacting the face 1 of the substrate 2 and the face 20 of the wafer 12, so as to give the structure shown in FIG. 4.

In order to cleave said structure, the complete structure shown in FIG. 4 undergoes a heat treatment. It should be noted that all the heat treatments used prior to cleaving such as ion bombardment and a possible surface treatment for joining purposes must be carried out at a temperature below the cleaving temperature. The heat treatment of the cleaving operation by a pressure effect and crystalline rearrangement brings about a cleaving along the layer of microbubbles 18. The solid portion 14 is separated from the thin portion 16, which then constitutes a thin section or film 16 joined to the substrate 2.

Thus, the structure obtained has tunnels constituted by trenches covered by the thin surface film, which can form a support for producing integrated circuits. In view of the very limited thickness of said film, as a result of the invention, it is e.g. possible to make openings through the film, which issue into the trenches or cavities. The deposition of metal layers through said openings, followed by the etching of structures on the film, which can be precisely positioned with respect to the trenches due to the limited film thickness, offer implementational perspectives not possible with a wafer or thick film or section.

I claim:

1. A process for producing a structure having a substrate, a thin surface film of a non-conducting material, joined to one face of the substrate, said substrate having cavities flush with said face, the process comprising the following successive steps:

etching cavities in one face of a substrate, the cavities having in the plane of the substrate face at least one dimension which is a function of the thickness of the surface film in order to correctly secure the latter;

joining a non-conducting material wafer having a solid portion, an intermediate layer and a thin film to the face of the substrate wherein said thin film is adjacent said face of the substrate;

thinning the wafer to obtain a thin surface section, the thinning of the wafer being obtained by separating the film of the solid portion from the intermediate layer;

wherein the intermediate layer is a layer of microbubbles between the thin film and the solid portion and obtained by prior implantation of gas in the wafer, and the separation of the film is brought about by cleaving the wafer along a cleaving plane defined by the microbubble layer.

2. A process for producing a structure having a substrate, a thin surface film of a non-conducting material, joined to one face of the substrate, said substrate having cavities flush with said face, the process comprising the following successive steps:

etching cavities in one face of a substrate, the cavities having in the plane of the substrate face at least one dimension which is a function of the thickness of the surface film in order to correctly secure the latter;

joining a non-conducting material wafer having a solid portion, an intermediate layer and a thin film to the face of the substrate wherein said thin film is adjacent said face of the substrate;

thinning the wafer to obtain a thin surface section, the thinning of the wafer being obtained by separating the film of the solid portion from the intermediate layer;

wherein the intermediate layer is formed by prior implantation of gas in the wafer and annealing, and the separation of the film is brought about by chemical etching of said intermediate layer.

3. Process according to claim 1 or claim 2, characterized in that each cavity has in the plane of the face of the substrate at least one dimension $l$ equal to or smaller than the maximum value $l_o$ proportional to the thickness of the surface film.

4. Process according to claim 3, characterized in that the wafer is of silicon and has a thickness $e_o$, giving $l_o=10.e_o$.

5. Process according to claim 1 or claim 2, characterized in that the cavities are longitudinal trenches.

6. A process for producing a structure having a substrate, a thin surface film of a non-conducting material, joined to one face of the substrate, said substrate having cavities flush with said face, the process comprising the following successive steps:

etching cavities in one face of a substrate, the cavities having in the plane of the substrate face at least one dimension which is a function of the thickness of the surface film in order to correctly secure the latter;

joining a non-conductive material wafer having a solid portion, an intermediate layer and a thin film to the face of the substrate wherein said thin film is adjacent said face of the substrate;

thinning the wafer to obtain a thin surface section, the thinning of the material wafer being brought about by mechanical, chemical and/or mechano-chemical abrasion of a portion of the wafer.

7. A process according to claim 6, wherein each cavity has in the plane of the face of the substrate at least one dimension l, equal to or smaller than the maximum value $l_o$ proportional to the thickness of the surface film.

8. A process according to claim 7, wherein the wafer is made of silicon and has a thickness $e_o$, giving $l_o=10.e_o$.

9. A process according to claim 6, wherein the cavities are longitudinal trenches.

10. Process according to claim 6, characterized in that the thinning of the wafer is brought about by grinding.

11. Process according to claim 6, characterized in that the thinning of the wafer is obtained by the polishing thereof.

* * * * *